United States Patent [19]

Sonoda et al.

[11] Patent Number: 5,250,822
[45] Date of Patent: Oct. 5, 1993

[54] FIELD EFFECT TRANSISTOR

[75] Inventors: Takuji Sonoda; Shinichi Sakamoto; Nobuyuki Kasai, all of Itami, Japan

[73] Assignee: Mitsubishi Denki Kabushiki Kaisha, Tokyo, Japan

[21] Appl. No.: 857,460

[22] Filed: Mar. 25, 1992

[30] Foreign Application Priority Data

Mar. 26, 1991 [JP] Japan .................................. 3-60636

[51] Int. Cl.[5] .................. H01L 29/161; H01L 29/205; H01L 29/225
[52] U.S. Cl. .................................. 257/194; 257/192; 257/280; 257/284
[58] Field of Search .................. 357/22; 257/192, 194, 257/283, 284

[56] References Cited

U.S. PATENT DOCUMENTS

| | | | |
|---|---|---|---|
| 4,558,337 | 12/1985 | Saunier | 257/194 |
| 4,689,115 | 8/1987 | Ibbotson et al. | 357/16 |
| 4,827,320 | 5/1989 | Morkoc et al. | 357/22 |
| 4,967,242 | 10/1990 | Sonoda et al. | 357/22 |
| 5,028,968 | 7/1991 | O'Loughlin et al. | 257/194 |
| 5,038,187 | 8/1991 | Zhou | 357/22 |
| 5,043,777 | 8/1991 | Sriram | 257/284 |
| 5,049,951 | 9/1991 | Goronkin et al. | 257/192 |
| 5,140,386 | 8/1992 | Huang et al. | 257/284 |

FOREIGN PATENT DOCUMENTS

| | | | |
|---|---|---|---|
| 59-124769 | 7/1984 | Japan | 257/194 |
| 60-86872 | 5/1985 | Japan | 257/194 |
| 60-193382 | 10/1985 | Japan | 257/194 |
| 62-266874 | 11/1987 | Japan | 257/194 |
| 63-60570 | 3/1988 | Japan | 257/284 |
| 63-155772 | 6/1988 | Japan | . |
| 3-55851 | 3/1991 | Japan | 257/192 |

OTHER PUBLICATIONS

Muller et al., *Device Electronics for IC's*, p. 130, 1986.
Moll et al, "Pulse-Doped AlGaAs/InGaAs Pseudomorphic MODFET's", IEEE Transactions on Electron Devices, vol. 35, No. 7, Jul. 1988, pp. 879–886.
Zipperian et al, "A GaAs/In$_{0.25}$Ga$_{0.75}$As/GaAs Modulation-Doped, Single, Strained Quantum-Well FET", International Symposium on Gallium Arsenide . . . , Sep. 1985, pp. 421–425.
Tserng et al, "Millimeter-Wave Power Transistors And Circuits", Microwave Journal, Apr. 1989, pp. 125–135.
Riaziat et al, "HEMT Millimetre Wave Monolithic Amplifier On InP", Electronics Letters, vol. 25, No. 20, Sep. 1989, pp. 1328–1329.
Nguyen et al, "Influence Of Quantum-Well Width On Device Performance of Al$_{0.30}$Ga$_{0.70}$As/In$_{0.25}$Ga$_{0.75}$As (On GaAs) MODFET's", IEEE Transactions on Electron Devices, vol. 36, No. 5, May 1989, pp. 833–838.
Yuen et al, "Application Of HEMT Devices To MMICs", Microwave Journal, Aug. 1988.
Frensley, "Power-Limiting Breakdown Effects In GaAs MESFET's", IEEE Transactions on Electron Devices, vol. ED-28, No. 8, Aug. 1981, pp. 962–970.
Rosenberg et al, "An In$_{0.15}$Ga$_{0.85}$As/GaAs Pseudomorphic Single Quantum Well HEMT", IEEE Electron Device Letters, vol. EDL-6, No. 10, Oct. 1985, pp. 491–493.
Fukui, "Channel Current Limitations In GaAs MESFETS", Solid State Electronics, vol. 22, 1978, pp. 507–515.

*Primary Examiner*—Andrew J. James
*Assistant Examiner*—Stephen D. Meier
*Attorney, Agent, or Firm*—Leydig, Voit & Mayer

[57] ABSTRACT

A field effect transistor includes a GaAs substrate on which an undoped GaAs layer is disposed. A doped electron supply layer is disposed on the undoped GaAs layer and has a negligible deep dopant level. A channel layer disposed on the electron supply layer has a larger electron affinity than the electron supply layer. The electron supply layer and the channel layer form a heterojunction. A third semiconductor layer having the same conductivity type as the electron supply layer is disposed on the electron supply layer. Gate, drain, and source electrodes are disposed on the third semiconductor layer. The dopant concentration of the third layer is smaller than the dopant concentration of the electron supply layer.

9 Claims, 6 Drawing Sheets

FIELD EFFECT TRANSISTOR

The present invention relates to a field effect transistor (FET) and more particularly to a power field effect transistor.

BACKGROUND OF THE INVENTION

A traveling-wave tube has been conventionally used as a power amplifier for microwave frequency signals. Recently, the use of MESFETs (metal semiconductor FETs) using a compound semiconductor, GaAs, in place of such traveling-wave tubes is attracting attention. However, in order to use MESFETs in place of traveling-wave tubes, it is necessary to improve the power and gain characteristics of MESFET's. An example of MESFET's is shown in FIG. 1. The MESFET shown in FIG. 1 comprises a semi-insulating GaAs substrate 1 and an active GaAs layer 2 on the substrate 1. The active GaAs layer 2 is doped with an N-type impurity. On the active layer 2, a drain electrode 3 and a source electrode 4 are disposed spaced from each other. A recess 5 is formed in the active layer 2 in the space between the drain and source electrodes. A metallic gate electrode 6 is disposed in the recess 5.

The maximum power of this MESFET is determined by the product of its maximum channel current If and its breakdown withstanding voltage VB (i.e. the maximum reverse voltage which can be applied between the gate electrode 6 and the drain electrode 3). According to an article "Channel Current Limitations in GaAs MESFETS" by Hatsuaki Fukui in *Solid-State Electronics*, Vol. 22, Pages 507-515, If can be expressed as:

$$If = q \cdot Vs \cdot Nd \cdot Z \cdot a(1 - Pm) \qquad (1)$$

In this equation (1), q is the unit charge, Vs is a saturation velocity, Nd is a doping concentration which is the quantity of charge per unit volume, Z is the width of the gate, a is the thickness of the GaAs layer 2 immediately beneath the gate electrode 6 (as indicated in FIG. 1), and Pm is the channel openability at the minimum reduced potential at the drain-side end of the gate. As is understood from the above equation (1), If is proportional to the product of the thickness a of the active layer 2, the doping concentration Nd in the layer 2 and the carrier saturation velocity Vs in the layer 2. On the other hand, according to an article "Power-Limiting Breakdown Effects in GaAs MESFET's" by William R. Frensley in *IEEE TRANSACTIONS ON ELECTRON DEVICES*, Vol. ED-28 No. 8, August 1981, Pages 962-970, VB is inversely proportional to the product of Nd and a, i.e. the amount of charge per unit area. Accordingly, it is possible to increase the maximum channel current If by increasing the saturation velocity Vs, without increasing the product of Nd by a, i.e. without reducing the breakdown withstanding voltage VB.

In order to increase the gain, it is necessary to increase the cutoff frequency $f_T$. It is known that the cutoff frequency $f_T$ is proportional to the saturation velocity Vs and inversely proportional to the gate length L. At the cutoff frequency $f_T$, which is the frequency at which the current amplification factor is unity (1), the current flowing through the gate-source capacitance $C_{gs}$ is expressed as $\omega_T C_{gs} Vi$, where Vi is the gate-source voltage, and $\omega_T$ is $2\pi f_T$. This current is equal to the current gmVi which flows in the drain, where gm is the transconductance. Then, the cutoff frequency $f_T$ is expressed as:

$$f_T = gm / 2\pi C_{gs}$$

where gm is $\epsilon Z Vs / W$. $\epsilon$ is the dielectric constant of the active layer 2, Z is the gate width, and W is the thickness of the depletion region in the active layer 2. More specifically, gm is defined as $\delta Id/\delta Vg$ at a drain voltage Vd held constant, where Id is a drain current, Vg is a gate voltage. From equation (1), the drain current Id is expressed as:

$$Id = q \cdot Nd \cdot Vs \cdot Z(a - a \cdot Pm) \qquad (2)$$

In the equation (2), a·Pm represents the thickness of the active layer 2. It is known that the thickness W of the depletion region in the active layer 2 can be expressed as:

$$W = \sqrt{2\epsilon(Vb - Vg)/q \cdot Nd} \qquad (3)$$

where Vb is an internal potential. From the equations (2) and (3), gm can be expressed as:

$$gm = \frac{1}{\sqrt{\frac{2\epsilon(Vb - Vg)}{q \cdot Nd}}} \cdot \epsilon \cdot Vs \cdot Z \qquad (4)$$

$$= \frac{\epsilon \cdot Z \cdot Vs}{W}$$

$C_{gs}$ can be expressed as $\epsilon LZ/W$. Accordingly, the cutoff frequency $f_T$ can be expressed, by substituting gm as expressed by the equation (4) and $\epsilon LZ/W$ for gm and $C_{gs}$, respectively, in the equation $f_T = gm/2\pi C_{gs}$, as $Vs/2\pi L$. This expression indicates that the cutoff frequency $f_T$ is proportional to the saturation velocity Vs and is inversely proportional to the gate length L.

Therefore, it is understood that increasing the saturation velocity Vs for the required product Nd.a for a desired VB is an efficient way to increase both the power and gain of an MESFET. For applications in which a high saturation velocity Vs is desired, an HEMT as shown in FIG. 2 may be advantageously used. The HEMT of FIG. 2 comprises a semi-insulating GaAs substrate 7, an undoped GaAs channel layer 8 on the substrate 7, and a heavily doped N-type $Al_xGa_{1-x}As$ electron supply layer 9 on the undoped GaAs channel layer 8. A recess 10, a gate electrode 11, a drain electrode 12, and a source electrode 13 similar to those of an MESFET are also included. The channel layer 8 has larger electron affinity than the electron supply layer 9 so that a heterojunction is formed between the electron supply layer 9 and the channel layer 8, and, accordingly, a two-dimensional electron gas layer 14 with a large saturation velocity is formed at the junction between the channel layer 8 and the electron supply layer 9.

In an HEMT, the maximum number of two-dimensional carriers per unit area, Ns, i.e., the maximum quantity of charge per unit area in a heterojunction, can be expressed as:

$$Ns = [2\epsilon N(\Delta Ec - Ef)/q]^{\frac{1}{2}} \qquad (5)$$

where $\epsilon$ is the dielectric constant of the channel layer 8, N is the free electron concentration of the N-type $Al_x$ $Ga_{1-x}As$ electron supply layer 9, ΔEc is the difference between the conduction band energies of the channel layer 8 and the electron supply layer 9 at the interface therebetween, Ef is the Fermi level, and q is the quantity of electrical charge. Frequently, x=0.3 is used for the electron supply layer 9 with silicon being used as an impurity. That is, Si-doped N-type $Al_{0.3}Ga_{0.7}As$ is frequently used for the electron supply layer 9. In this case, the concentration of free electrons N does not monotonically increase with the Si doping level. This is because in Si-doped N-type $Al_{0.3}Ga_{0.7}As$, a deep level called a DX center is formed. The upper limit of N is about $1 \times 10^{18}$ cm$^{-3}$. Substitution of N≈$1 \times 10^{18}$ cm$^{-3}$, ε=$8.85 \times 10^{-14} \times 12.5$, ΔEc=0.2244 eV, Ef≈0.1 eV, and q=$1.6 \times 10^{-19}$ in equation (5), indicates that the maximum number of two-dimensional carriers Ns is about $1 \times 10^{12}$ cm$^{-2}$. The value for ΔEc has been calculated by assuming that the energy gaps of $Al_{0.3}Ga_{0.7}As$ and GaAs are 1.798 eV and 1.424 eV, and multiplying the difference by 0.6. With the quantity of charge per unit area, Ns, being used in place of the quantity of charge per unit volume, Nd·a, in equation (1), the maximum channel current If for the HEMT can be expressed as follows. It should be noted that because of the HEMT, no depletion region is formed in the two-dimensional electron gas layer 14 and, therefore, the term a·Pm is removed.

$$If = q \cdot Vs \cdot Ns \cdot Z \quad (6).$$

Substituting $1.6 \times 10^{-19}$ (C), $2 \times 10^7$ (cm/second), $1 \times 10^{12}$ (cm$^{-2}$), and 0.1 (cm) for q, Vs, Z, respectively, in equation (6), it is seen that If is 0.32 A/mm. It is known that in order to provide a breakdown withstanding voltage VB of 25 V or higher for a GaAs MESFET having a gate recess with steps, the product Nd·a should be $2.4 \times 10^{12}$ charge/cm$^2$. In this case, assuming that Z=0.1 cm, If calculated from equation (1) is 400 mA/mm. Thus, it is seen that If for HEMTs is smaller than If for MESFETs.

The breakdown withstanding voltage VB of HEMTs is also inversely proportional to the product of the quantity of electrical charge per unit area or doping concentration Nd and the thickness a of the electron supply layer 9. Accordingly, in order to obtain the maximum number of two-dimensional carriers per unit area, i.e., an Ns of about $1 \times 10^{18}$ cm$^{-2}$, the doping concentration of silicon must be $4 \times 10^{18}$ cm$^{-3}$ and the thickness a must be 350 Å. In other words, the free electron concentration N for Ns of about $1 \times 10^{12}$ cm$^{-2}$ can be calculated by substituting the above-quoted values for q, ε, Ns, ΔEc, and Ef in the equation N=q·Ns$^2$/2ε(ΔEc−Ef), which is derived from equation (5). From the calculation it is seen that the required N is $5.83 \times 10^{17}$ cm$^{-3}$. Since a deep level is formed, the free electron concentration N of N-type $Al_xGa_{1-x}As$ is about 10–20% of the silicon doping level when x is equal to 0.3. Accordingly, for obtaining a free electron concentration N of, for example, 15% of the silicon doping level, the silicon doping concentration Nd should be $5.83 \times 10^{17}/0.15 \approx 4 \times 10^{18}$ cm$^{-3}$.

The number of two-dimensional carriers per unit area, Ns, is determined by the product of the thickness d of the electron supply layer 9, which supplies two dimensional carriers, by the free electron concentration N. Thus, the thickness d should be Ns/N=$1 \times 10^{12}/5.83 \times 10^{17} \approx 172$ Å. Since the gate electrode 11 is a metallic electrode, a depletion region will be formed in the electron supply layer 9. From the equation (3), the thickness W of the depletion region, when the gate bias is 0 V, is:

$$W = (2\epsilon Vb/q \cdot Nd)^{\frac{1}{2}}$$

where Vb is 0.92 V. Thus, the thickness W is 178 Å. Then, the thickness a of the electron supply layer 9 is equal to d+W, which is equal to 350 Å.

The doping concentration Nd and the thickness a of the electron supply layer 9 of HEMTs are $4 \times 10^{18}$ cm$^{-3}$ and 350 Å, respectively, and, accordingly, Nd·a is equal to $14 \times 10^{12}$ cm$^{-2}$. This value is substantially larger than the product Nd·a of ordinary GaAs MESFETs which is equal to $2.4 \times 10^{12}$ cm$^{-2}$. This means that the breakdown withstanding voltage VB of HEMTs is 4–5 V which is very small. Thus, by virtue of having a high saturation velocity Vs, an HEMT has a high cutoff frequency $f_T$ and an improved gain, but its maximum channel current If and breakdown withstanding voltage are small. Therefore, it is difficult to provide HEMTs with an improved power characteristic.

To sum up, the saturation velocity Vs can be improved for conventional N-type AlGaAs/GaAs HEMTs, but there is an upper limit on the free electron concentration for N-type AlGaAs, and, because of this limitation, the maximum channel current If cannot be increased and the breakdown withstanding voltage is less than one-half of that of MESFETs.

SUMMARY OF THE INVENTION

A field effect transistor according to the present invention includes a heterojunction structure having at least one heterojunction formed therein by at least one electron supply layer and at least one channel layer. The electron supply layer comprises a doped first semiconductor material having a deep level therein which is substantially negligible. The channel layer comprises an undoped second semiconductor material which has a larger electron affinity than the first semiconductor layer. The field effect transistor further includes a third semiconductor layer doped to have the same conductivity type as the electron supply layer. The third semiconductor layer is disposed on the heterojunction structure. A gate electrode, a source electrode, and a drain electrode are disposed on the third semiconductor layer. The doping concentration of the third semiconductor layer is less than the doping concentration of the electron supply layer.

GaAs may be used as a material for the electron supply layer, together with InGaAs for the channel layer and GaAs for the third semiconductor layer. Alternatively, AlGaAs can be used for the electron supply layer. In this case, InGaAs and GaAs may be used for the channel layer and the third semiconductor layer, respectively. According to another aspect of the invention, the heterojunction structure may comprise an electron supply layer and channel layers disposed on the opposite surfaces of the electron supply layer so that heterojunctions are formed on the opposite sides of the electron supply layer. According to still another aspect of the invention, the heterojunction structure may comprise a plurality of combinations of electron supply and channel layers, each of which includes a heterojunction formed between the electron supply and channel layers.

DETAILED DESCRIPTION OF EMBODIMENTS

Figure 1:
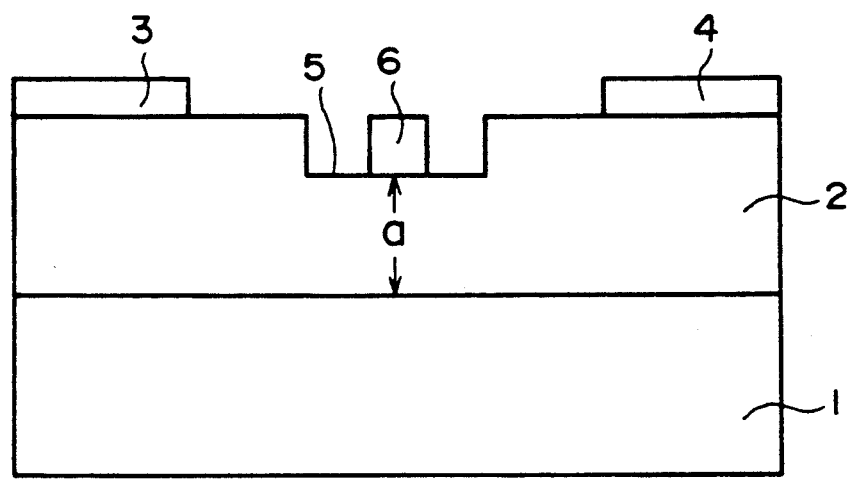
FIG. 1 is a cross-sectional view of a conventional GaAs MESFET.
Figure 2:
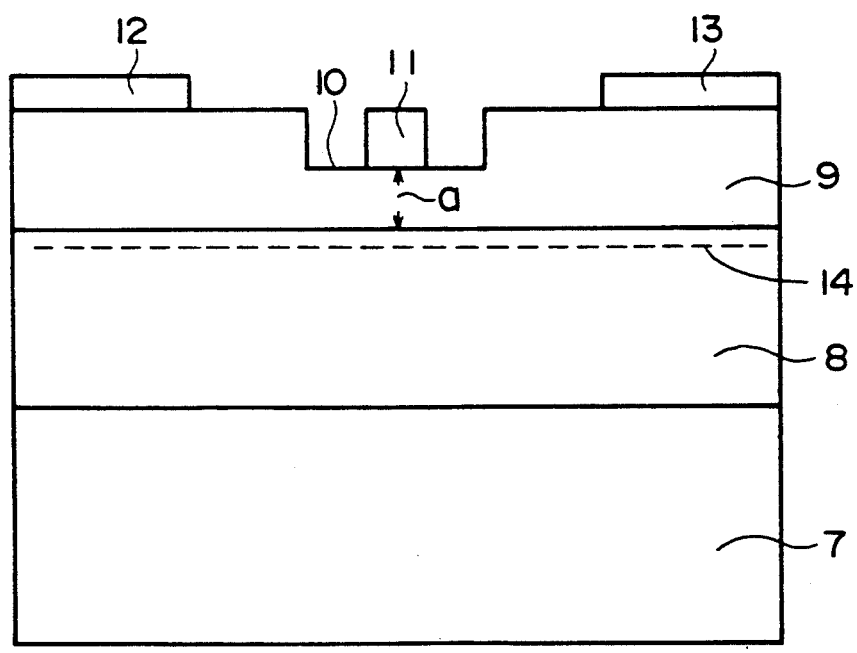
FIG. 2 is a cross-sectional view of a conventional N-type AlGaAs/GaAs HEMT.
Figure 3:
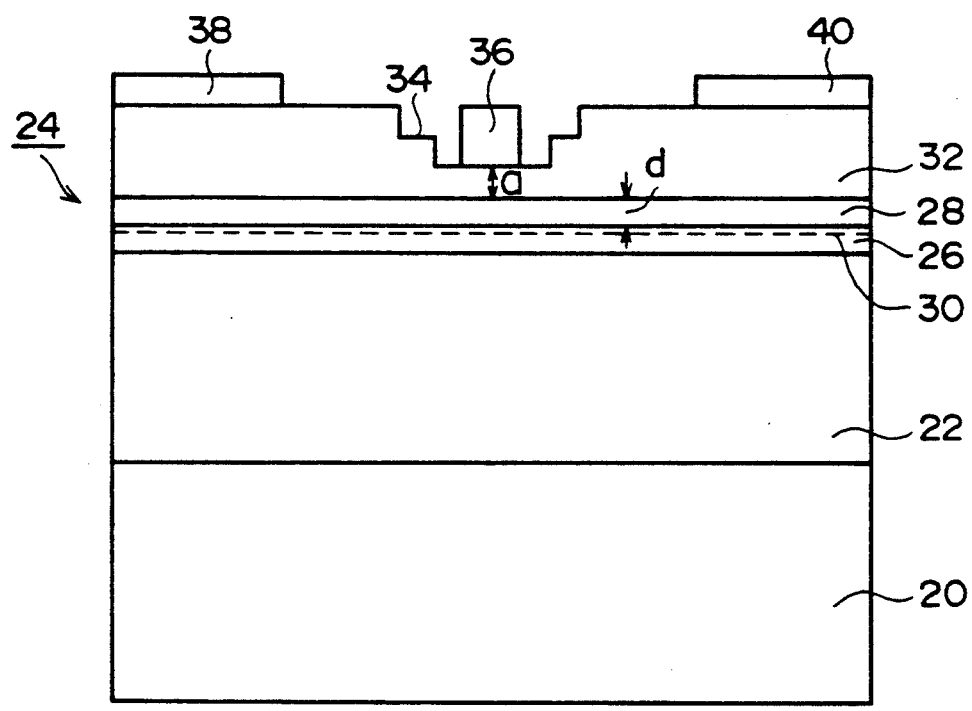
FIG. 3 is a cross-sectional view of an FET according to one embodiment of the present invention.

FIG. 3 shows an field effect transistor (FET) according to one embodiment of the present invention. The transistor shown in FIG. 3 is a power FET, which includes a substrate 20 of semi-insulating material, for example, GaAs. On the top surface of the GaAs substrate 20, a buffer layer, such as an undoped GaAs layer 22, is disposed. The thickness of the undoped GaAs layer 22 may be about 1 μm, for example.

A heterojunction structure 24 is disposed on the undoped GaAs layer 22. The heterojunction structure 24 includes a first semiconductor layer 28 which may act as an electron supply layer, and a second semiconductor layer 26 which may act as a channel layer with the channel layer 26 being disposed on the undoped GaAs layer 22. The electron supply layer 28 is disposed on the channel layer 26. A heterojunction is formed at the interface between the channel layer 26 and the electron supply layer 28. As a result, a two-dimensional electron gas layer 30 is formed in the channel layer 26 adjacent to the heterojunction. The channel layer 26 comprises undoped $In_xGa_{1-x}As$ which has a larger saturation velocity than GaAs. The electron supply layer 28 comprises GaAs doped with silicon. GaAs has smaller electron affinity than $In_xGa_{1-x}As$. When doped with, for example, silicon, which acts as an impurity, GaAs has a doping concentration Nd and a carrier concentration which are substantially the same. The saturation velocity Vs of $In_xGa_{1-x}As$ is dependent on the proportion x of In, i.e. increases with increase of x. A lattice match cannot be achieved between GaAs and $In_xGa_{1-x}As$ and, therefore, the thickness of the channel layer 26 must be limited to a thickness less than the critical thickness at which dislocation due to lattice mismatch could occur. The critical thickness decreases with increasing of x. x = 15% and a thickness of 150 Å are suitable for the $In_xGa_{1-x}As$ channel layer for forming a heterojunction with GaAs. In the present embodiment, therefore, the thickness of the channel layer 26 is 150 Å. The thickness d of the electron supply layer 28 is calculated from the ratio of the two-dimensional electron concentration Ns to the carrier concentration N, i.e. Ns/N. Since Ns is chosen to be $0.888 \times 10^{12}$ cm$^{-2}$, as will be described later, when the carrier concentration N in GaAs is $1.5 \times 10^{18}$ cm$^{-3}$, a thickness of about 60 Å is sufficient for the thickness d of the layer 28, in principle. However, as will be described later, the electron supply layer 28 is manufactured by, for example, MBE, and the thickness of the layer 28 is chosen to be about 100 Å, taking manufacturing tolerance into account.

A third semiconductor layer, such as an N-type GaAs layer 32 in which a Schottky gate depletion region can be formed is disposed on the electron supply layer 28. In a central portion of the GaAs layer 32, a two-stepped recess 34 is formed in a known manner. A metal gate electrode 36 is disposed within the recess 34. A source electrode 38 and a drain electrode 40 are disposed on the GaAs layer 32 on the opposite sides of the gate electrode 36. The gate length of the gate electrode 36 is, for example, 0.5 μm.

The doping quantity Nd of the GaAs layer 32 in which the Schottky gate depletion region is to be formed is substantially equal to the carrier concentration N, as stated above, because the material is GaAs. It is, therefore, chosen to be within a range of from $0.5 \times 10^{17}$ cm$^{-3}$ to $0.8 \times 10^{17}$ cm$^{-3}$, for example, to be $0.8 \times 10^{17}$ cm$^{-3}$. The thickness a of the layer 32 immediately beneath the gate electrode 36 is chosen to be 0.11 μm. This value is chosen in order to cause the entire thickness to become a depletion region when the gate bias is 0 volts. The thickness W of the depletion region at 0 volt gate bias is determined according to $(2\epsilon Vb/q \cdot Nd)^{\frac{1}{2}}$. When $\epsilon$ is $8.85 \times 10^{-14} \times 12.5$, the internal voltage Vb is 0.75 V, and q is $1.6 \times 10^{-19}$, the depletion region thickness W is about 0.11 μm. Thus, the thickness a is chosen to be 0.11 μm. The undoped GaAs layer 22, the channel layer 26, the electron supply layer 28, and the Schottky gate depletion GaAs layer 32 are fabricated by, for example, MBE, the recess is formed by etching, and the gate, source and drain electrodes 36, 38, 40 are fabricated by, for example, vapor deposition.

In the GaAs/$In_{0.15}Ga_{0.85}As$ structure of the FET constructed as described above, since the energy gap of GaAs is 1.424 eV and that of $In_{0.15}Ga_{0.85}As$ is 1.194 eV, the difference ΔEg in energy gap between the two materials is 0.23 eV, and, therefore, ΔEc is 0.138 eV, because it is considered to be 0.6 times ΔEg. In contrast, in the $Al_{0.3}Ga_{0.7}As$/GaAs structure of a conventional HEMT, since the energy gap of $Al_{0.3}Ga_{0.7}As$ is 1.798 eV and that of GaAs is 1.424 eV, the energy gap difference is 0.374 eV and, therefore, ΔEc which is 0.6 times ΔEg is 0.224 eV. Thus, ΔEc of the GaAs/$In_{0.15}Ga_{0.85}As$ structure is about 0.615 times that of the $Al_{0.3}Ga_{0.7}As$/GaAs. This means that the GaAs/$In_{0.15}Ga_{0.85}As$ structure has a smaller two-dimensional electron concentration Ns.

However, the saturation velocity Vs of $In_{0.15}Ga_{0.85}As$ is about $2.4 \times 10^7$ cm/second, which is about 1.2 times the saturation velocity Vs of $Al_{0.3}Ga_{0.7}As$ which is about $2.0 \times 10^7$ cm/second. With the carrier concentration and the thickness of the GaAs electron supply layer 28 being $1.5 \times 10^{18}$ cm$^{-3}$ and 100 Å, respectively, as stated previously, and assuming that the Fermi level is 0.1 eV, then the two-dimensional electron concentration Ns is:

$$\begin{aligned} Ns &= [2\epsilon N(\Delta Ec - Ef)/q]^{\frac{1}{2}} \\ &= [2 \times 8.85 \times 10^{-14} \times 12.5 \times 1.5 \times 10^{18} \times \\ &\quad 0.038/(1.6 \times 10^{-19})]^{\frac{1}{2}} \\ &= 0.888 \times 10^{12} \end{aligned}$$

The two-dimensional electron concentration Ns of the present embodiment is reduced to about 89% of that of the conventional $Al_{0.3}Ga_{0.7}As/GaAs$ HEMT which is equal to $1.0\times10^{12}$ as stated above. In this embodiment, however, the maximum channel current density If can be calculated, from equation (6), to be 342 mA/mm for the same gate width of 0.1 cm as the conventional HEMT. This maximum channel current density increases to about 1.07 times that of the conventional HEMT which is equal to 320 mA/mm.

The maximum current If in the Schottky gate depletion GaAs layer 32 with forward bias being applied can be calculated from equation (1). For calculation, assume that a is 0.11 μm as stated above. Pm is, as stated in the previously cited H. Fukui article, $Pm \approx 0.94 (EcL/Wp)^{\frac{1}{2}}$, where Ec is a critical electric field, L is a gate length, and Wp is an overall gate pinch-off voltage. Wp is referenced to the zero bias state and, therefore, equal to the barrier voltage, for example, 0.75 V. Assuming that the saturation velocity is $1.4\times10^7$ cm/second, L is 0.5 μm and Ec is 0.29 eV as indicated in the Fukui article, Pm is equal to 0.397. Then, from the equation (1), If is 119 mA/mm. Accordingly, the maximum channel current density flowing between the drain and the source is 461 mA/mm (=342 mA/mm+119 mA/mm), which is greater than the maximum channel current density of a conventional GaAs MESFET which is 400 mA/mm. In this case, the forward bias voltage applied is, for example, 1.5 V.

In addition, the quantity of charge per unit area of the illustrated embodiment is $1.5\times10^{18}$ cm$^{-3}\times1\times10^{-6}$ cm $+0.8\times10^{17}$ cm$^{-3}\times1.1\times10^{-5}$ cm $=2.38\times10^{12}$ charge/cm$^2$. This value is smaller than the previously discussed quantity of charge per unit area of the HEMT that is $2.4\times10^{12}$ charge/cm$^2$. Furthermore, a breakdown withstanding voltage of about 25 V can be attained.

Figures 4A, 4B, 4C:
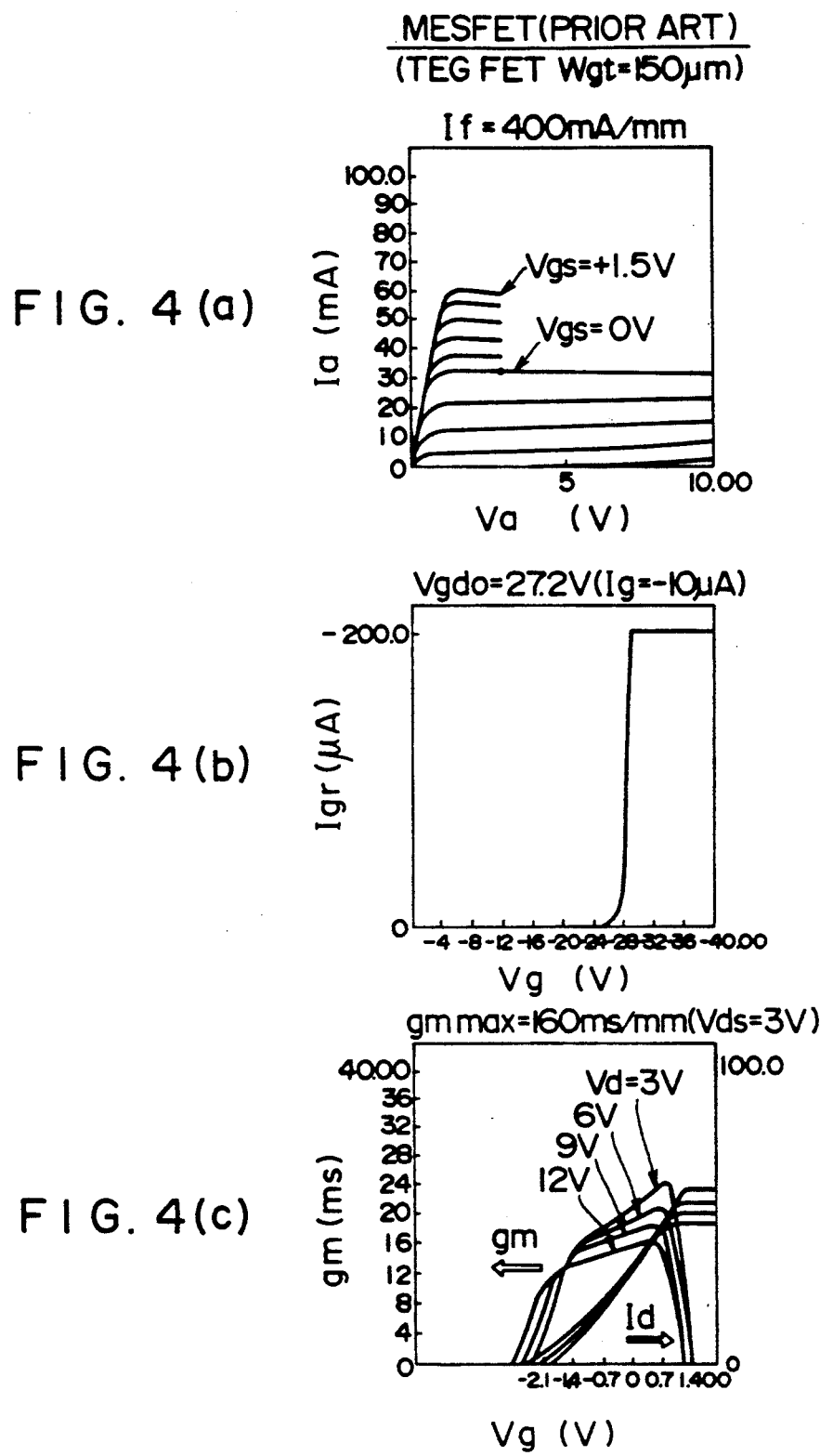
FIGS. 4(a)–4(c) show DC characteristics of the conventional GaAs MESFET shown in FIG. 1.
Figure 5A:
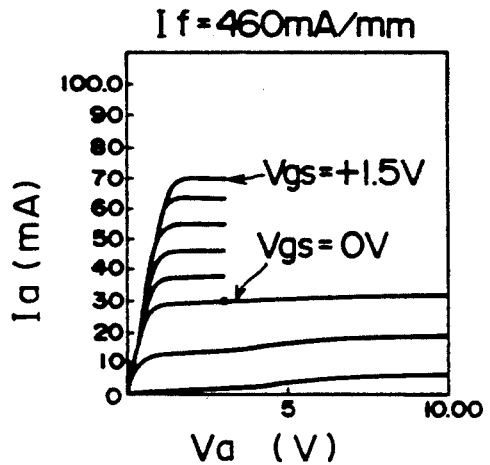
FIGS. 5(a)–5(c) show DC characteristics of the FET of the present invention shown in FIG. 3.
Figure 5B:
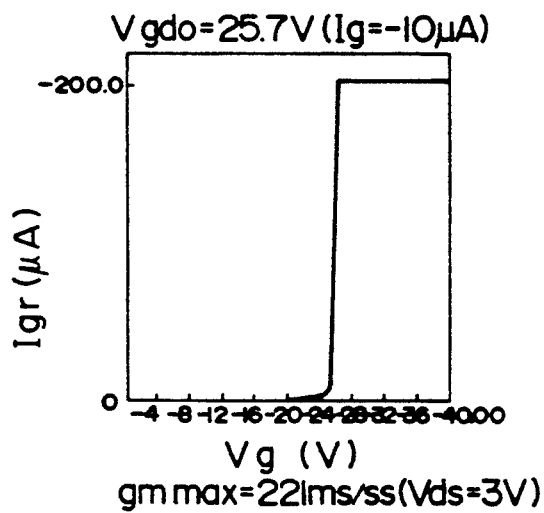
Figure 5C:
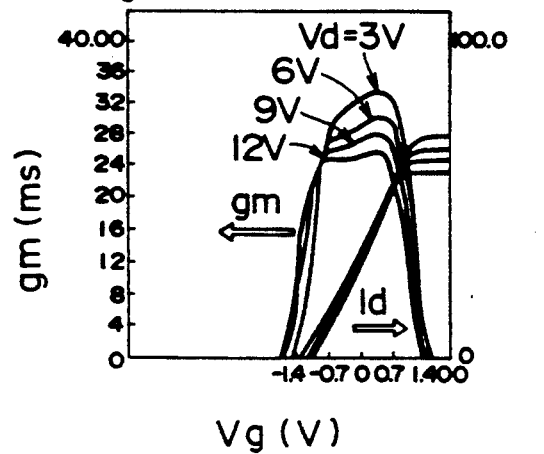

FIGS. 4(a)–4(c) and FIGS. 5(a)–5(c) show the maximum channel current density If, the breakdown withstanding voltage VB and the transconductance gm of the conventional GaAs MESFET (FIGS. 4(a)–4(c)) and of the FET of the illustrated embodiment of the present invention (FIGS. 5(a)–5(c)), where the gate width in both transistors is 150 μm. The conventional GaAs MESFET has an If of 400 mA/mm, a VB of 27 V, and a maximum gm (gmmax) of 160 ms/mm (Vds=3 V), whereas the FET of the embodiment of the present invention has a VB of 25 V, an If of 460 mA/mm, and a gm of 221 ms/mm (Vds=3 V). In other words, in the embodiment of the present invention, If and gm are improved without degrading the breakdown withstanding voltage VB. gm is expressed as $\epsilon ZVs/W$, as stated above, and, in the present embodiment, since the saturation velocity Vs is improved, the transconductance gm is also improved.

Figure 6:
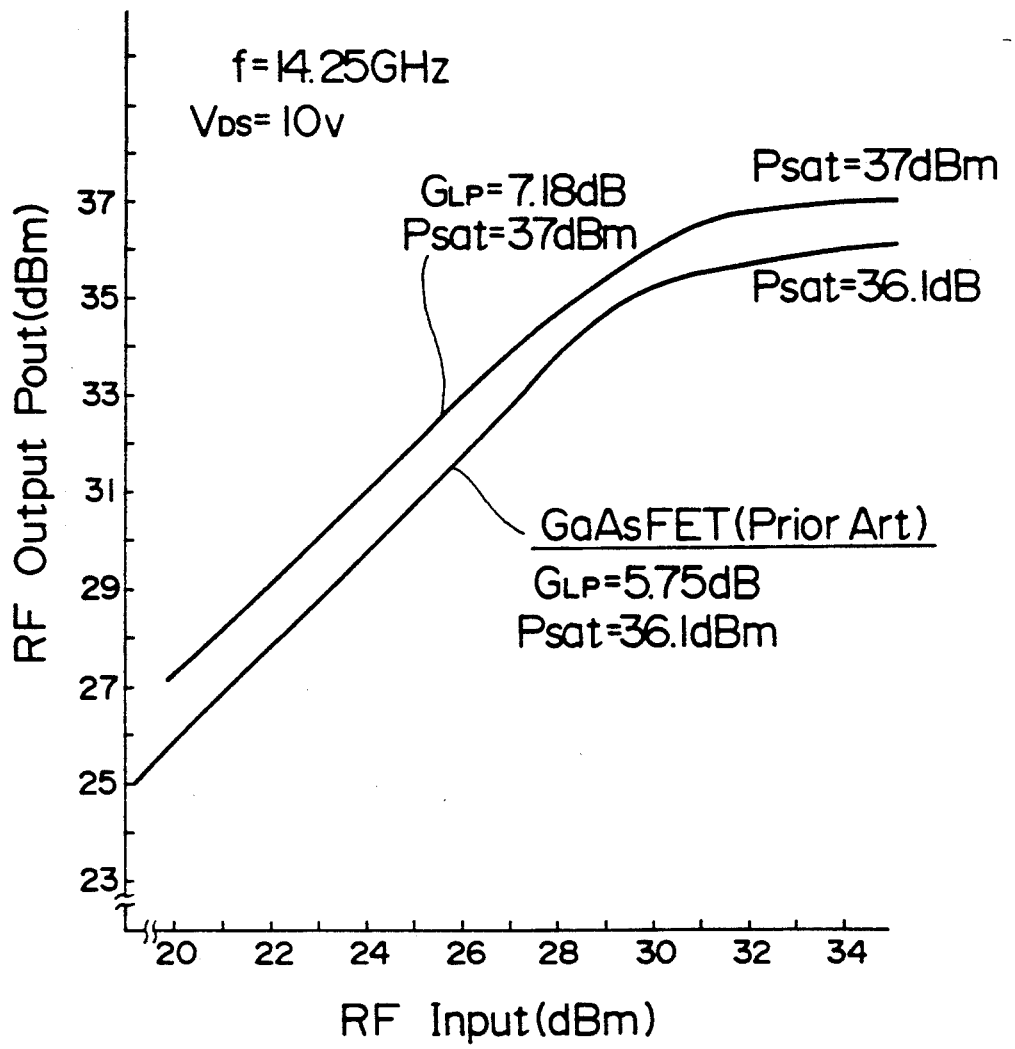
FIG. 6 shows high frequency characteristics of the GaAs MESFET shown in FIG. 1 and the FET of the present invention shown in FIG. 3.

FIG. 6 shows the high frequency characteristic at 14.25 GHz of an internally matched (i.e. self-matching) FET with an overall gate width of 10.5 mm fabricated in accordance with the present invention, in contrast to that of a conventional internally matched FET with the same gate width. It is seen that both the saturated output (Psat) and the gain in the linear region ($G_{LP}$) are improved by 1 dB.

Figure 7:
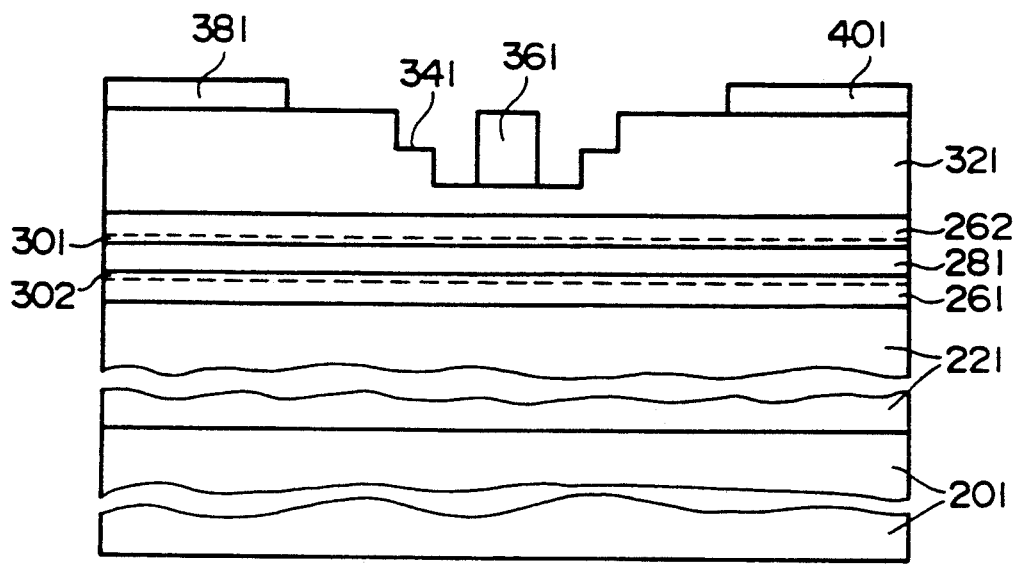
FIG. 7 is a cross-section view of an FET according to another embodiment of the present invention.
Figure 8:
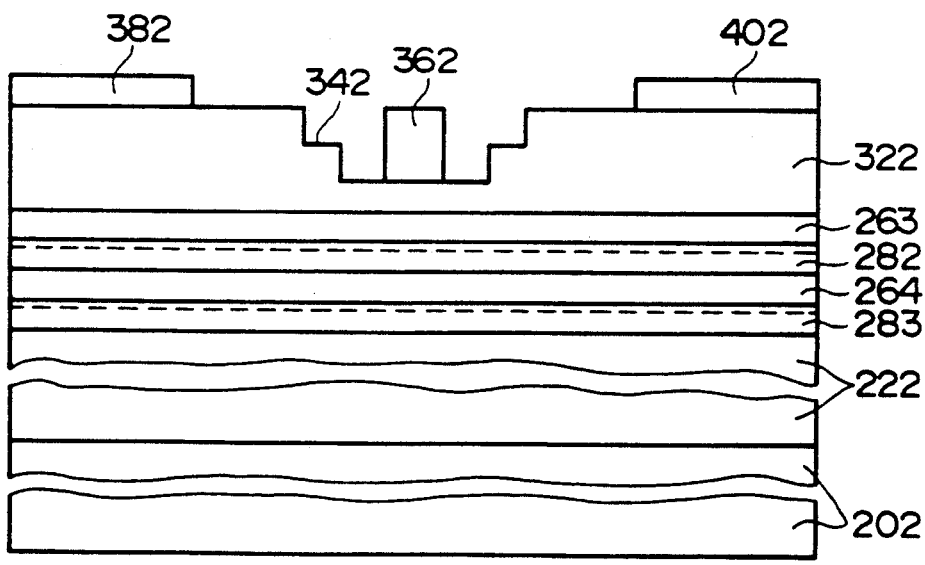
FIG. 8 is a cross-sectional view of an FET according to still another embodiment of the present invention.

In place of GaAs in the embodiment of FIG. 3, $Al_xGa_{1-x}As$ (where $0<x\leq0.2$) may be used for the electron supply layer 28. Furthermore, the heterojunction structure 24 is shown in FIG. 3 to comprise the electron supply layer 28 and the single channel layer 26 beneath the layer 28. However, channel layers 261 and 262 may be disposed on the top and bottom surfaces of the electron supply layer 281 so as to form heterojunctions on both sides of the electron supply layer 281, as shown in FIG. 7. Similar to the embodiment shown in FIG. 3, the embodiment of FIG. 7 also includes a GaAs substrate 201, an undoped GaAs layer 221, a GaAs layer 321 in which a depletion region is formed, a recess 341, a gate electrode 361, a source electrode 381, and a drain electrode 401. The electron supply layer 281 may be formed of either GaAs or $Al_xGa_{1-x}As$ (where $0<x\leq0.2$), as in the embodiment of FIG. 3. Furthermore, although the heterojunction structure 24 of FIG. 3 comprises a combination of one electron supply layer and one channel layer, it may comprises a plurality of such combinations, as shown in FIG. 8. In FIG. 8, two such combinations are used, in which one combination comprises an electron supply layer 263 and a channel layer 282 and the other comprises an electron supply layer 264 and a channel layer 283. The FET of FIG. 8 also comprises a GaAs substrate 202, an undoped GaAs layer 222, a GaAs layer 322 in which a depletion region is to be formed, a recess 342, a gate electrode 362, a source electrode 382, and a drain electrode 402. In this example, too, $Al_xGa_{1-x}As$ (where $0<x\leq0.2$) may be used for the electron supply layers 282 and 283. However, in this case, the thickness and doping concentration of each electron supply layer must be selected such that the sum of quantities of charge per unit area of the respective electron supply layers and the quantity of charge per unit area of the GaAs layer 322 in which a GaAs Schottky gate depletion region is to be formed, is less than the above-described value, $2.4\times10^{12}$ charge/cm$^2$. Further, in the above-described embodiments, a GaAs layer (32, 321 or 322) is used as the third semiconductor layer in which a Schottky gate depletion region is formed, but an $In_xGa_{1-x}As$ layer (where $x>0$) may be used instead.

What is claimed is:

1. A field effect transistor comprising:
   a heterojunction structure having at least one doped first semiconductor electron supply layer having a first electron affinity, a shallow dopant impurity concentration, and a substantially negligible deep dopant energy level and at least one undoped second semiconductor channel layer having a second electron affinity larger than the first electron affinity contacting and forming a heterojunction with said at least one electron supply layer;
   a layer of a third semiconductor material contacting one of said at least one electron supply and channel layers and having the same conductivity type as said at least one electron supply layer and a dopant concentration of less than the dopant concentration of said at least one electron supply layer; and
   gate, drain, and source electrodes in contact with said third semiconductor material layer.

2. A field effect transistor according to claim 1 wherein said heterojunction structure comprises one electron supply layer and two channel layers, said two channel layers being respectively disposed on opposite sides of said electron supply layer.

3. A field effect transistor according to claim 1 wherein said heterojunction structure comprises a plurality of heterojunctions, a plurality of channel layers, and a plurality of electron supply layers, each heterojunction comprising one of said electron supply layers and one of said channel layers.

4. A field effect transistor comprising:

a doped first semiconductor electron supply layer having a first electron affinity, a shallow dopant impurity concentration, and a substantially negligible deep dopant energy level;

an undoped second semiconductor channel layer having a second electron affinity larger than the first electron affinity, said channel layer being disposed in contact with said electron supply layer;

a layer of a doped third semiconductor material in contact with said electron supply layer opposite said channel layer, said third semiconductor material having the same conductivity type as said electron supply layer and a dopant concentration of less than the dopant concentration of said electron supply layer; and gate, drain, and source electrodes in contact with said third semiconductor material layer.

5. A field effect transistor according to claim 4 wherein said electron supply layer is GaAs, said channel layer is InGaAs, and said third semiconductor material is GaAs.

6. A field effect transistor according to claim 5 wherein the dopant concentration of said electron supply layer is about $1.5 \times 10^{18}$ cm$^{-3}$ and the dopant concentration of said third semiconductor material is within the range from about $0.5 \times 10^{17}$ cm$^{-3}$ to about $0.8 \times 10^{17}$ cm$^{-3}$.

7. A field effect transistor according to claim 4 wherein said electron supply layer is AlGaAs, said channel layer is InGaAs, and said third semiconductor material is GaAs.

8. A field effect transistor according to claim 4 wherein said layer of a third semiconductor material is thinner between said gate electrode and said electron supply layer than between said source and drain electrodes and said electron supply layer.

9. A field effect transistor according to claim 8 wherein said layer of the third semiconductor material between said gate electrode and said electron supply layer is sufficiently thin to be entirely depleted of charge carriers when no gate bias voltage is applied to said gate electrode.

* * * * *